(12) United States Patent
Jonker et al.

(10) Patent No.: US 8,828,497 B2
(45) Date of Patent: Sep. 9, 2014

(54) METHOD AND USE OF A BINDER FOR PROVIDING A METALLIC COAT COVERING A SURFACE

(75) Inventors: Robert Alexander Jonker, Enschede (NL); Arnoldus G. W. Van Andel, Oosterhout (NL)

(73) Assignee: De Heller Design B.V., Enschede (NL)

( * ) Notice: Subject to any disclaimer, the term of this patent is extended or adjusted under 35 U.S.C. 154(b) by 0 days.

(21) Appl. No.: 13/643,362

(22) PCT Filed: Apr. 26, 2011

(86) PCT No.: PCT/EP2011/056575
§ 371 (c)(1),
(2), (4) Date: Dec. 20, 2012

(87) PCT Pub. No.: WO2011/134956
PCT Pub. Date: Nov. 3, 2011

(65) Prior Publication Data
US 2013/0236653 A1 Sep. 12, 2013

(30) Foreign Application Priority Data
Apr. 28, 2010 (NL) ................................. 2004623

(51) Int. Cl.
| | |
|---|---|
| B05D 1/04 | (2006.01) |
| B05D 3/12 | (2006.01) |
| H05K 3/14 | (2006.01) |
| B05D 1/12 | (2006.01) |
| B05D 1/06 | (2006.01) |
| B05D 1/34 | (2006.01) |
| B05D 5/06 | (2006.01) |
| B05D 3/10 | (2006.01) |
| B05D 3/02 | (2006.01) |

(52) U.S. Cl.
CPC .. *B05D 1/12* (2013.01); *H05K 3/14* (2013.01); *H05K 2203/122* (2013.01); *B05D 3/12* (2013.01); *B05D 2503/00* (2013.01); *B05D 1/04* (2013.01); *B05D 1/34* (2013.01); *B05D 5/067* (2013.01); *B05D 1/06* (2013.01); *B05D 3/107* (2013.01); *H05K 2203/1344* (2013.01); *B05D 1/045* (2013.01); *B05D 3/0263* (2013.01)
USPC .......... 427/470; 427/466; 427/469; 427/475; 427/367

(58) Field of Classification Search
USPC .......................... 427/466, 469, 470, 475, 367
See application file for complete search history.

(56) References Cited

U.S. PATENT DOCUMENTS

| | | | | |
|---|---|---|---|---|
| 3,236,679 | A * | 2/1966 | Spiller et al. ................ | 427/475 |
| 3,391,455 | A * | 7/1968 | Hyogo Hirohata et al. .... | 29/852 |
| 5,518,546 | A * | 5/1996 | Williams et al. .............. | 118/621 |
| 2004/0115477 | A1 | 6/2004 | Nesbitt | |
| 2008/0032060 | A1* | 2/2008 | Nesbitt ........................ | 427/470 |

FOREIGN PATENT DOCUMENTS

GB 1 529 997 10/1978

* cited by examiner

*Primary Examiner* — Frederick Parker
(74) *Attorney, Agent, or Firm* — Karl Bozicevic; Bozicevic, Field & Francis LLP

(57) ABSTRACT

A method for providing a metallic coat covering a surface is disclosed, which comprises: (i) applying an electrically conductive two component binder on said surface; (ii) electrostatic spraying a metal powder on the binder applied in step (i); wherein the metal powder comprises metal particles with an average diameter less than 80 micron.

1 Claim, 4 Drawing Sheets

BACKGROUND

METHOD AND USE OF A BINDER FOR PROVIDING A METALLIC COAT COVERING A SURFACE

FIELD OF THE INVENTION

The present invention relates to a method for providing a metallic coat covering a surface. According to another aspect, the present invention relates to the use of a binder for providing a metallic coat.

DESCRIPTION OF RELATED ART

Metallic coatings change the properties of surfaces to the properties of the metal being applied. For example metallic coatings may provide an attractive appearance such as the gleam of polished metals. Further, metallic coatings may protect a surface against for example moisture, salt spray, oxidation and wear resistance. Metallic coatings are widely used in the automotive industry, construction sector, offshore industry or for decoration and restoration of objects.

Generally, a metal coat is provided by mixing small amounts of metal powder with a binder whereafter the mixture is applied to a surface. Additionally, processes are known wherein mixtures comprising a binder and a metal powder are sprayed on an object. Generally, such a binder comprises polyester and epoxy.

Another known process for providing a metallic coat is galvanizing, wherein an object is usually dipped into a bath of a melted metal of interest. An example is the protection of a metal object by covering it with a zinc coat.

These prior art methods have several drawbacks. A first drawback can be found in the precipitation of a metal powder in a mixture of a binder and a metal powder. This precipitation may cause a non equal coat. Moreover, the pot-life of the mixture of binder and metal powder is limited. Another drawback of mixtures comprising a metal powder and a binder is that the saturation of the binder with metal powder is limited. For example, in spraying techniques for applying a mixture of a binder and metal powder the amount of metal powder that can be mixed with the binder is limited.

Further, current galvanizing methods are hazardous for the environment. The galvanizing process requires for example high energy consumption since large amounts of metal has to be heated. Further, galvanizing methods produce toxic metal sludge waste as a result of the required use of solvents and acids.

BRIEF SUMMARY OF THE INVENTION

Considering the above conventional methods and their drawbacks and limitations, there is a need in the art for a more efficient and sustainable method for applying a metallic coat, which should result in a metallic coat with good properties.

Therefore, it is an objective of the present invention, amongst other objectives, to provide a method for providing a metallic coat.

This objective, amongst other objectives, is met by a method as defined herein.

Specifically, this objective is met by a method for providing a metallic coat covering a surface, comprising the steps:
(i) applying an electrically conductive two component binder on said surface;
(ii) electrostatic spraying a metal powder on the binder applied in step (i);
wherein the metal powder comprises metal particles with an average diameter less than 80 micron.

A metallic coat as used in the present context denotes a coat, a layer, a film or a sheet of a metal.

Covering a surface, as used in the present context, should be understood according to its interpretation by the skilled person in the technical field of metallic coatings. For example, covering may denote a constant or uniform covering, protecting, sealing or masking of a surface by evenly distributing a layer on the present surface.

The present surface may be any kind of surface. For example surfaces of a three dimensional object.

Applying of the present binder may be provided via several techniques. Examples of application techniques are non-spraying techniques such as dip coating, flow coating, dip-spin coating or roll coating, or spray techniques such as conventional air atomization, airless spraying, air-assisted airless atomization, high volume low pressure air atomizing spray or flame spray coating. Further, applying an electrically conductive two component binder on the present surface may thereby provide a surface with an applied binder. Still further, applying an electrically conductive two component binder on the present surface may take place for a time period sufficient to provide an evenly distributed coat, cover, layer or mask over the present surface.

With the term 'electrically conductive two component binder' is intended to mean that the two component binder as well as the layer of applied two component binder, or at least the layer of the applied two component binder is electrically conductive.

Electrostatic spraying of the metal powder on the applied binder comprises charging an atomized powder comprising metal particles by, for example, an electrostatic spray gun which metal particles are then attracted by the electrically conductive binder. Preferably, the step of electrostatic spraying of a metal powder on the binder applied takes place for a period of time sufficient to saturate the binder with metal particles.

The present electrostatic spraying of a metal powder on the binder applied may provide a metallic coat covering the present surface. Preferably the metallic coat covering the present surface is less than 200 micron thick.

The present metal powder may comprise one kind of metal or may comprise a metal alloy. Further, each metal, or metal alloy, may be used in the present invention.

Preferably the present step (ii) follows immediately, or directly, after present step (i), i.e. without allowing the present electrically conductive two component binder applied to dry.

The inventors of the present invention found that by a method according to the present invention a metallic coat is provided in an efficient, environmental friendly and sustainable way. For example in comparison with conventional galvanizing processes; none large amounts of metal (such as baths filled with metal) are required, thus heating costs are reduced significantly.

Additionally, by using the present method, a metallic coat is provided with a high percentage of metal particles. More specifically, the saturation of the binder, or matrix, with metal powder is maximal. An advantage of such a maximal saturation of the binder, or the matrix, is that an easy final processing, when desired, of the coated surface is provided.

Moreover, the inventors found that the metallic coat obtained has the properties and appearance of the metal used, e.g. a perfect metal-like gleam is obtained.

Another advantage of the method of the present invention is that the application force of the electrostatic applied metal powder on the binder is such low that the prior applied binder is not pushed away. Accordingly, a perfect flat surface is obtained.

Yet another advantage of the method of the present invention is that the method enables the providing of said advantageous coat on any surfaces such as vertical, leaning, or not horizontal surfaces or even three dimensional surfaces. Thus, a perfect smooth surface with an evenly distributed and maximal saturation of the matrix, i.e. the binder, with the present metal powder is provided on these vertical, leaning, or not horizontal surfaces or even three dimensional surfaces.

Moreover, by use of the present method, thin metallic coats can be obtained. Typically such a layer is less than 200 micron thick. When a thicker metallic coat is desired, the present steps of the method can be repeated, for example for one, two, or three times.

Typically, by using the present method the provided metallic coat is electrically conductive. This is advantageous in for example the production of printed circuit boards. Accordingly the present method can replace the currently applied etching processes.

According to a preferred embodiment of the present method, applying of the electrically conductive two component binder comprises airless spraying. An advantage of using airless spraying is that the method is fast and applicable on high-speed production lines or where surface areas are large.

Preferably the two components of the electrically conductive two component binder are mixed in the nozzle of a spray device. This is advantageous since none premixed binder is required, avoiding problems with the short pot-life of suspensions and, moreover, may provide a continue process. Such a continue process is advantageous for providing a metallic coat covering large surfaces.

According to a preferred embodiment of the present method, the two component binder comprises polyurethane and/or polyurea and between 0.2 and 10% (w/w) quaternary nitrogen compounds, such as 1, 2, 3, 4, 5, 6, 7, 8 or 9, or 0.2 or 1 to 9%, preferably 0.5 to 8% or less than 10, 6, 5 or 4% (w/w) quaternary nitrogen compounds. Preferably the quaternary nitrogen compounds are quaternary ammonium salts. Further, the two component binder may comprise an isocyanate, such as an aromatic polyisocyanate. Preferably, the binder comprises diphenylmethane-4.4-diisocyanate. The binders are special developed to be suitable for application of metal powders by electrostatic spraying. Further, the binders enable the method of the present invention to be carried out inside as well as outside. Moreover, the binders are resistant to UV light, acids, caustics, salts and solvents as well as to temperatures in the range of $-30$ to $+130°$ C. The present binder may comprise fillers or additives for influencing the surface tension and viscosity of the binder and/or the present binder may comprise additives such as defoamers or wetting agents. Fillers and additives are commonly known by the skilled person of the present technical field.

A solvent free binder has advantages in processing metal powders which oxidate in the presence of water, such as iron. Additionally, the present binder has a low viscosity and/or low surface tension. The advantage of a binder with low viscosity and/or low surface tension is the veracious reproduction of original details in the surface, without filling these original details with the coat. This can be very important, for example in the field of art reconstruction such as the reconstruction of bronze statues and busts or for classic wooden picture frames.

According to a further preferred embodiment of the present method, the polyurethane and/or polyurea is dispersed in a vegetable oil chosen from the group consisting of castor oil, soy bean oil, sunflower oil and canola oil. More preferably the polyurethane is dispersed in castor oil. An example of polyurethane in castor oil is the commercial available ALBODUR 921 of Alberdingk Boley.

According to yet another preferred embodiment of the method of the present invention, the metal particles have an average diameter smaller than 60 micron, preferably between 2 to 55 micron, such as 2 to 40, 2 to 30 or 2 to 20, or 5 to 55, 10 to 55, 20 to 55 or 30 to 55 micron.

Preferably the metal particles have a spherical shape. However, the metal particles may also have a nodular shape or irregular shape. The metal particles may also have any combination of said shapes. Moreover, all metals or metal alloys may be used. Some examples of metals are chromium, iron, nickel, lead, zinc, tin, platinum, silver, gold, copper or cadmium particles and combinations thereof such as bronze and brass. For example is copper used for providing copper (roof) panels. An advantage of this application is that copper (roof) panels of each size can be obtained without being dependent of the normal trading measures of such construction panels.

According to yet another preferred embodiment, the present method comprises applying a primer on the surface prior to the present step of applying the electrically conductive two component binder. By using a primer, the present method is applicable in an even broader range. Some surfaces require such a preliminary treatment. For example fresh moulded concrete due to its alkalinity. Secondly, the preliminary treatment by primers avoids leakage of the binder in a strongly absorbing surface, before the metal powder is applied on the applied binder. Further, smooth surfaces may require a preliminary treatment comprising roughening of the surface by etching or by mechanical means. Preferably, the present binder is used as a primer. However, other, common used and commercial available primers are also encompassed by the present invention.

According to yet another preferred embodiment, the present method comprises subjecting the metallic coat covering a surface to a drying step, preferably comprising subjecting the metallic coat covering a surface to infra-red light. However, the coated surface may also be subjected to another source of heat. Preferably the metallic coat covering a surface is subjected to a drying step for a period of time sufficient to cure the metallic coat covering a surface.

According to yet another preferred embodiment, the present method comprises after the present step (ii) one or more steps selected from the group consisting of patination, polishing, protecting and sanding. This step of patination, polishing, protecting and/or sanding takes place after the present optional dry step. Patination may be understood in the present context as applying a patina layer. The aim of applying such a layer is to influence the natural oxidation process in order to obtain a certain effect. Such a patination step may comprise treating of the metallic coated surface with acids, such as copper nitrate in water, calcium carbonate or ammonium chloride for the greening of copper, or with bases. Another possibility is to shortly treat the metallic coated surface with a flame, in order to color the metallic coat. Other finishing steps for the coat, such as applying a transparent top coating, for example for curing a copper surface, are also encompassed by the present invention.

According to yet another preferred embodiment, the present method forms a metallic coat which is less than 200 micron thick, such as less than 180, 160, 140, 120 or even less than 100 micron. The advantage of such a thin coat is the veracious reproduction of original details in the surface, without filling these original details with coat. This can be very important, for example in the field of art reconstruction such as the reconstruction of bronze statues and bursts.

According to yet another preferred embodiment the present surface is a circuit board, or plastic support, a roof, a panel or floor panels such as parquet floor parts. The present method has a wide variety of applications. For instance, the present method can be used in order to provide printed circuit boards by producing small lanes of metallic coat on a support, e.g. a plastic support. In this application the currently used etching is avoided. Contrary, the present method can be used in order to provide panels with a metallic coat. These panels are normally used in the field of construction for finishing outer or upper areas, or surfaces, or buildings. Moreover the present surface may be ceramics, crosses, weathercocks, picture frames and/or (other) art objects. For instance for gilding these subjects.

Accordingly, according to yet another aspect, the present invention relates to coated surfaces obtainable by a method of the present invention. These coated surfaces excel in a smooth, constant, equal coat wherein the matrix, i.e. the binder, is completely saturated with metallic powder. This metallic coat may have a thickness of less than 200 micron, such as less than 180, 160, 140, 120 or even less than 100 micron. Moreover, the metallic coat has the properties of the metal being applied, for example is the coat electrically conductive.

According to yet another aspect, the present invention relates to the use of an electrically conductive two component binder comprising polyurethane and/or polyurea dispersed in castor oil and 1 to 10% (w/w) quaternary nitrogen compounds, preferably ammonium salts, preferably, for providing a metallic coat, preferably a metallic coat covering a surface. Wherein the provided metallic coat has a thickness of less than 200 micron and/or is electrically conductive. Moreover, the present invention relates to the use of an electrically conductive two component binder comprising polyurethane and/or polyurea dispersed in castor oil and 1 to 10% (w/w) quaternary nitrogen compounds, preferably ammonium salts, for providing a metallic coat on ceramics, crosses, weathercocks, picture frames and/or (other) art objects, and/or on panels such as roof panels or parquet panels and plastic supports. For instance, these plastic supports are intended to form, by the present method, printed circuit boards.

BRIEF DESCRIPTION OF THE DRAWINGS

The invention is further elucidated in the following non-limiting examples of preferred embodiments. In the examples, reference is made to the appended figures wherein.

DETAILED DESCRIPTION OF THE INVENTION

EXAMPLE

Comparative Example

A 3 dimensional object is coated with a conventional method.

Figure 1:
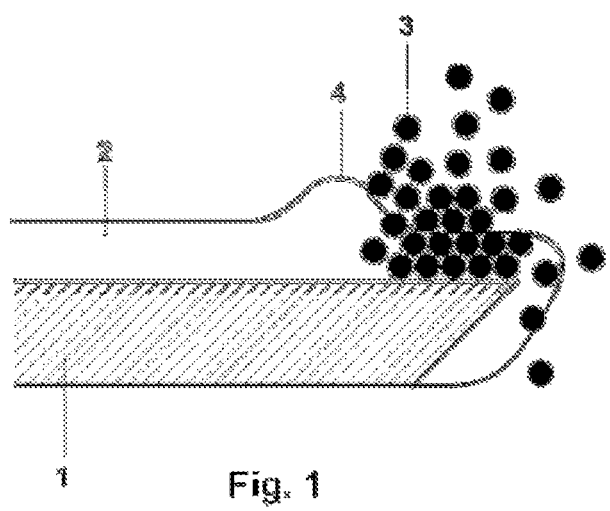
FIG. 1: shows a schematic view applying copper particles (3) on a binder (2) which is applied to the object (1).

More specifically, a two component polyurethane binder ('ALBODUR 921' of Alberdingk Boley) is applied by airless spraying on the surfaces of the object. Subsequently, a metal powder comprising copper particles with an average diameter of 30 micron were applied to the binder by scattering of the metal powder to the binder. FIG. 1 shows how the copper particles (3) reach the binder (2) on the object (1) by gravity. Thereafter the applied coat is cured by subjecting it to ultra red light and a polishing step was performed.

A metallic coat was obtained. However, the saturation of the matrix was not complete and equal. Specifically, by applying the copper powder, the binder is moved away which resulted in a rough surface, as can be seen in FIG. 1, number 4.

Example 1

A 3 dimensional object is coated with a method according to the present invention.

Figure 2:
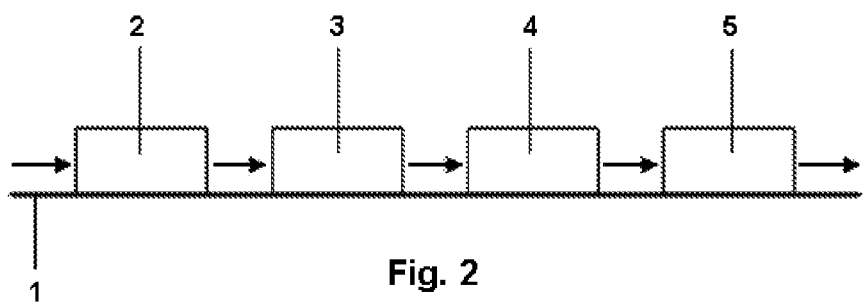
FIG. 2: shows a schematic process for providing a metallic coat according to the present invention.

FIG. 2 is a schematic overview of the method followed in this example. More specifically, FIG. 2 shows transport means (1), wherein the placed 3 dimensional object is placed an is subjected to applying of the binder (2), electrostatic applying of the metal powder (3), drying (4) and finally grating and/or polishing (5).

More specifically, the binder used is a two component polyurethane binder dispersed in castor oil, namely the 'ALBODUR 921' of Alberdingk Boley. The second component is diphenylmethane-4.4-diisocyanate. This two component polyurethane binder is made electrically conductive by mixing it with commercially available quaternary nitrogen compounds sold under the name of 'Tego@ADDID 240' from Evonik Industries AG, until a mixture comprising 5% quaternary nitrogen compounds is obtained.

Forthcoming, this mixture is applied to the surface of the 3 dimensional object by airless spraying.

Figure 3:
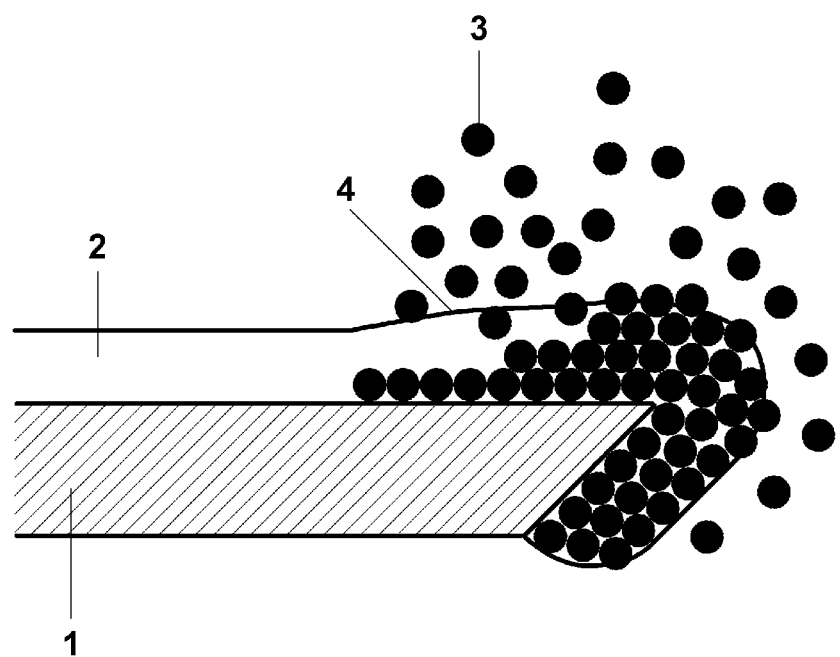
FIG. 3: schematically shows applying of the copper particles (3) by electrostatic spraying to binder (2) on object (1).

Subsequently, a metal powder comprising copper particles with an average diameter of 30 micron is applied by use of an electrostatic spray gun. FIG. 3 shows a schematic insight in electrostatic spraying the copper particles in the binder. The copper particles 3 reach the binder (2) on object (1).

Thereafter, the coated object is subjected to infrared in order to cure the coat.

Finally, the coat is polished by Bristle Brushes available from 3M.

Figure 4:
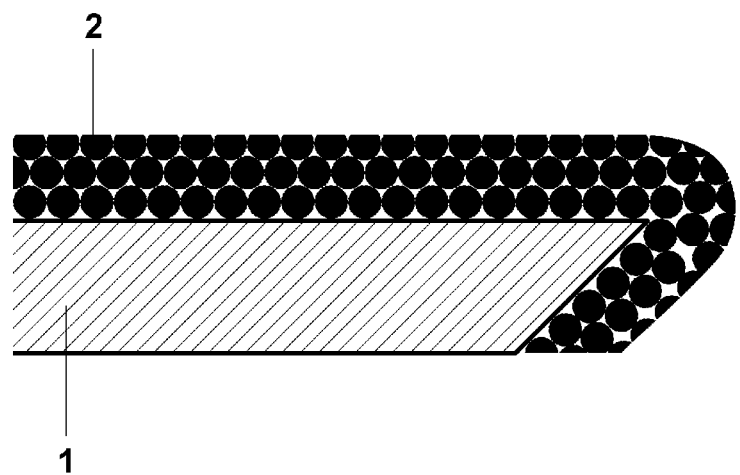
FIG. 4: schematically shows an object coated with a copper coat provided with a method according to the present invention.

A perfect smooth coat was obtained as is shown schematically in FIG. 4. FIG. 4 shows a complete and equal saturation of the matrix, i.e. the binder, on horizontal as well as on the leaning surface of the 3 dimensional object.

Example 2

The steps of example 1 were followed on a similar 3 dimensional object. However the binder was a two component binder of polyurea in castor oil, and the second component was diphenylmethane-4.4-diisocyanate. This two component binder is made electrically conductive by mixing it with commercially available quaternary nitrogen compounds sold under the name of 'Tego @ ADDID 240' from Evonik Industries AG, until a mixture comprising 3% quaternary nitrogen compounds is obtained.

The 3 dimensional object exhibited a smooth coat with a complete and equal saturation of the matrix, i.e. the binder, on horizontal as well as on leaning surfaces.

The invention claimed is:

1. A method for providing a metallic coat covering on a surface, comprising:

(a) applying a primer to a surface to create a primer layer;

(b) airlessly spraying an electrically conductive two component binder onto the primer layer to create a conductive layer, wherein the two components are mixed in a nozzle of a spray device and are comprised of a polymer selected from the group consisting of polyurethane and polyurea and between 0.2% and 10% (W/W) quarternary nitrogen compounds; and (c) electrostatically spraying a metal powder onto the conductive layer, wherein the metal powder comprises metal particles having an average diameter in a range of from 2 microns to 55 microns; and (d) polishing the surface wherein the surface is selected from the group consisting of a circuit board, a roof and a panel.

\* \* \* \* \*